United States Patent [19]

Culpepper

[11] Patent Number: 4,813,045
[45] Date of Patent: Mar. 14, 1989

[54] LASER DRIVER
[75] Inventor: Charles F. Culpepper, Ithaca, N.Y.
[73] Assignee: Tektronix, Inc., Beaverton, Oreg.
[21] Appl. No.: 889,993
[22] Filed: Jul. 28, 1986
[51] Int. Cl.[4] .......................... H01S 3/00; H01S 3/10
[52] U.S. Cl. ......................................... 372/38; 372/26
[58] Field of Search ................................. 372/38, 26

[56] References Cited
U.S. PATENT DOCUMENTS
3,648,073 3/1972 Sams et al. .......................... 372/38

OTHER PUBLICATIONS
5.6 Laser Drivers from "Topics in Applied Physics-Semiconductor Devices for Optical Commercial", Springer-Verlay.

Primary Examiner—William L. Sikes
Assistant Examiner—Georgia Y. Epps
Attorney, Agent, or Firm—Francis I. Gray; William K. Bucher

[57] ABSTRACT

A laser driver which compensates for package parasitics at high frequencies has a current source to drive a laser diode. A modulation signal is input to an impedance matched buffer amplifier. A common-emitter amplifier is connected to the output of the buffer amplifier and operates as the current source.

3 Claims, 1 Drawing Sheet

LASER DRIVER

BACKGROUND OF THE INVENTION

The present invention relates to laser drivers, and more particularly to a laser driver which allows high-frequency continuous-wave modulation of laser diodes in the presence of package reactance.

Currently laser diodes are driven from a fifty (50) ohm source via a matching impedance transmission line which is AC coupled directly to the laser. The laser diode is enclosed in an hermetic package which in turn is mounted on a circuit board. At high frequencies the package parasitics due to the bond wires which connect the package to the circuit board tend to degrade the peformance of the laser diode since the bond wires tend to act as a series LC circuit.

What is desired is a laser drive circuit which compensates for the package parasitics to minimize laser diode degradation at high frequencies.

SUMMARY OF THE INVENTION

Accordingly the present invention provides a laser driver which allows high-frequency continuous-wave modulation of laser diodes in the presence of package reactance with a minimum of degradation. The modulation signal is input via a common-base buffer amplifier to a common-emitter amplifier operating in a current source mode and having an essentially constant amplitude a.c. component. The current from the current source drives the laser diode.

The objects, advantages and novel features of the present invention will be apparent from the following detailed description when read in conjunction with the appended claims and attached drawing.

DESCRIPTION OF THE PREFERRED EMBODIMENT

Figure 1:
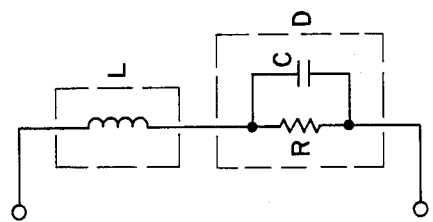
FIG. 1 is an equivalent schematic view of a laser diode with associated package parasitics.

Referring now to FIG. 1 an equivalent circuit for a laser diode D is shown. The laser diode is equivalent to a parallel combination of a resistor R and a capacitor C. In series with the laser diode D is shown a series inductance L which represents the reactance of the bond wires connecting the laser diode package to a circuit board. As is apparent, if a conventional voltage driven, direct drive circuit is used to modulate the laser diode D, as indicated by the intermittent dotted line 10 in FIG. 2, the reactance L created by the bond wires acts as a voltage divider with the laser diode. Since the reactance L is directly related to frequency, at high frequencies more of the drive voltage appears across the reactance, resulting in reduction of the drive current to the laser diode D with concomitant degradation in performance.

Figure 2:
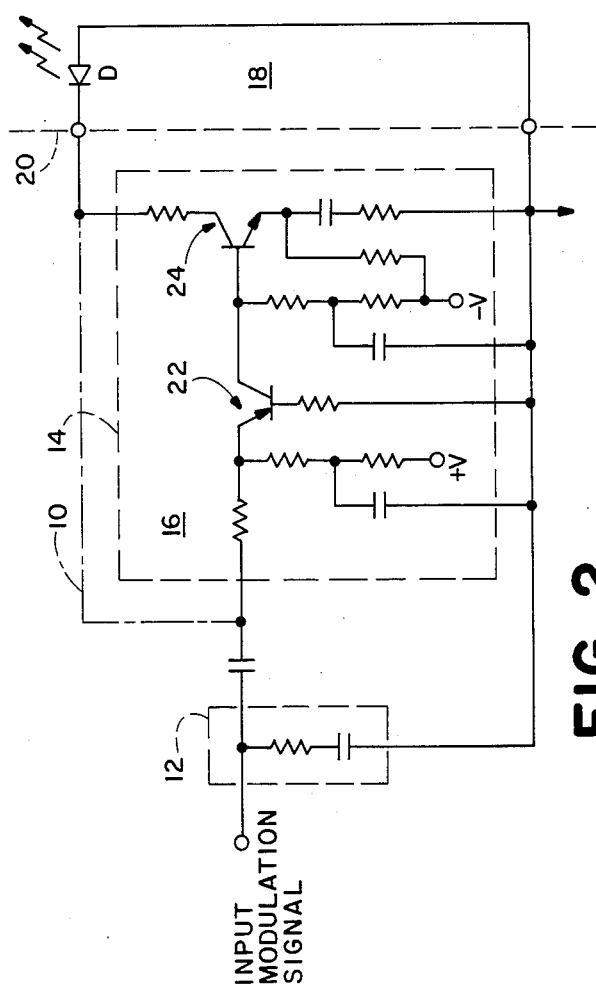
FIG. 2 is a schematic view of a laser driver according to the present invention.

As shown in FIG. 2 an input modulation signal is applied to an input RC impedance matching circuit 12 and AC coupled to the laser driver circuit 14 which is located on a circuit board 16. The laser diode D is situated in a package 18 and connected to the circuit board via bond wires. The bond wire interface between the circuit board 16 and the package 18 is indicated by a dotted line 20. The laser driver circuit 14 has an input common-base buffer amplifier 2 to which the input modulation signal is applied at the emitter. The collector of the buffer amplifier 22 is input to the base of a common-emitter amplifier 24 which is biased to operate in a current source mode. The collector of the common-emitter amplifier 24 is connected to the laser diode D to provide the drive current. Also, as is well known in the art, emitter degeneration of the common-emitter amplifier 24 and interstage coupling between the buffer amplifier 22 and the common-emitter amplifier can be changed to flatten response. The quiescent point of the laser diode D is determined by another stage (not shown) connected to the laser diode through a low pass filter, as is well known in the art.

Since the current to the laser diode D is derived from the common-emitter amplifier 24 operating as a current source, the effect of the reactance L is minimized as, regardless of frequency, the laser diode is driven by a constant amplitude a.c. component of the drive current. Thus the voltage divider effect of the reactance L is essentially eliminated, and the performance of the laser diode D is not degraded.

Therefore, the present invention provides a laser driver which uses a current source with an essentially constant amplitude a.c. component to drive a laser diode in order to eliminate package parasitics due to bond wire reactance at high frequencies.

What is claimed is:

1. A laser driver for a laser diode comprising:
   an impedance matched input buffer amplifier to which a modulation signal is applied; and
   a current source coupled to the output of the impedance matched input buffer amplifier, the output of the current source providing an essentially constant amplitude a.c. current component coupled to drive the laser diode.

2. A laser driver as recited in claim 1 wherein the impedance matched input buffer amplifier comprises:
   an input impedance matching circuit to which the modulation signal is applied; and
   a common-base amplifier with the emitter coupled to the input impedance matching circuit to receive the modulation signal.

3. A laser driver as recited in claim 2 wherein the current source comprises a common-emitter amplifier coupled to the collector of the common-base amplifier, the common-emitter amplifier having its collector coupled to the laser diode to provide the essentially constant amplitude a.c. drive current.

* * * * *